United States Patent
Jain et al.

[11] Patent Number: 6,040,552
[45] Date of Patent: Mar. 21, 2000

[54] HIGH-SPEED DRILLING SYSTEM FOR MICRO-VIA PATTERN FORMATION, AND RESULTING STRUCTURE

[76] Inventors: Kanti Jain, 18 Algonquian Trail, Briarcliff Manor, N.Y. 10510; Thomas J. Dunn, 1497 Cross Rd., Mohegan Lake, N.Y. 10547; Nestor O. Farmiga, 43 Ward St., Clifton, N.J. 07011; Carl Weisbecker, 122 Fairview Ave., Port Chester, N.Y. 10573; Carl C. Kling, 22 Annadale St., Armonk, N.Y. 10504

[21] Appl. No.: 08/794,217

[22] Filed: Jan. 30, 1997

[51] Int. Cl.[7] .................................................. B23K 26/00
[52] U.S. Cl. .................................. 219/121.7; 219/121.73; 219/121.77; 359/629
[58] Field of Search ..................... 219/121.73, 121.77, 219/121.74, 121.75, 121.7, 121.71; 359/629

[56] References Cited

U.S. PATENT DOCUMENTS

| | | | |
|---|---|---|---|
| 5,055,653 | 10/1991 | Funami et al. | 219/121.77 |
| 5,101,091 | 3/1992 | Grub et al. | 219/121.74 |
| 5,113,055 | 5/1992 | Kuriyama | 219/121.74 |
| 5,138,490 | 8/1992 | Hohberg et al. | 219/121.74 |
| 5,362,940 | 11/1994 | MacDonald et al. | 219/121.73 |
| 5,517,000 | 5/1996 | Nishiwaki et al. | 219/121.77 |
| 5,539,175 | 7/1996 | Smith et al. | 219/121.7 |
| 5,571,429 | 11/1996 | Smith et al. | 219/121.73 |
| 5,601,733 | 2/1997 | Partlo . | |
| 5,657,138 | 8/1997 | Lewis et al. | 219/121.73 |
| 5,674,414 | 10/1997 | Schweizer | 219/121.77 |
| 5,676,866 | 10/1997 | In den Bäumen et al. | 219/121.77 |
| 5,798,867 | 8/1998 | Uchida et al. | 359/629 |
| 5,811,754 | 9/1998 | Nakatani et al. | 219/121.73 |

FOREIGN PATENT DOCUMENTS

| | | | |
|---|---|---|---|
| 61-17392 | 1/1986 | Japan | 219/121.74 |
| 6-238476 | 8/1994 | Japan | 219/121.73 |

*Primary Examiner*—Geoffrey S. Evans
*Attorney, Agent, or Firm*—Carl C. Kling

[57] ABSTRACT

Economical production of laser-drilled high-precision, ultra-miniature multiple-via-hole patterns is accomplished by multiplexing the homogenized, shaped, nearly-collimated output of a high-power excimer laser into a modular set of condenser lens/mask/projection lens beamlines. A substrate delivery subsystem provides a continuous supply of film substrate segments as blanks during production. Functional modularization permits the building and easy retooling of a hard-tooling multiple-beamline system powered by a high-power laser. Vertical modularization permits the building of a single-beamline soft-tooling pilot system, which may be used to demonstrate a production technique, or may be used for short production runs, and which may later be incremented with additional vertical subassemblies for additional beamlines. Multiplexing of the laser output beam into the set of beamlines is accomplished by an illumination module, which may be implemented as a single 100%-reflective fold mirror for a single-beamline pilot system, and can also be implemented as a single-block echelon mirror, or implemented as a multi-beamsplitter set of decreasing-reflectivity mirrors as mirror position approaches the beam source. The resulting product is a film blank with a via-pattern of precise micro-vias, useful as an aerosol nozzle or filter.

28 Claims, 6 Drawing Sheets

HIGH-SPEED DRILLING SYSTEM FOR MICRO-VIA PATTERN FORMATION, AND RESULTING STRUCTURE

BACKGROUND OF THE INVENTION

1. Field of the Invention

This invention relates to a via-drilling system and, more particularly, this invention relates to a low-cost, high-throughput drilling system for micro-via arrays, wherein energy from a single high-energy laser beam is multiplexed into multiple sub-beams to provide a related finite number of patterning beamlines, each beamline being equipped with appropriate mask-projection optics, for simultaneously drilling a finite number of separate, high-quality, mask-controlled multiple-micro-via patterns into a substrate.

2. Description of Related Art

The desire for multi-hole patterns of ultra-miniature via holes which are precisely located and are of precise dimensions (micro-via patterns) is recognized in the fields of multi-layer integrated circuits, ink-jet print heads, aerosol generation and micro-filtering, as well as in other fields as those fields become more miniaturized. Miniaturization has far exceeded the capability of the metal drill bit, at least for high-precision via-drilling in hard substrates, because of bit breakage and bending which destroys the symmetry and precision of the via-hole. Laser drilling has become the art of choice for drilling micro-via patterns in hard substrates. However, laser drilling is quite costly, and prior art technologies typically produce via-holes with low aspect ratios (hole depth:hole diameter) of $\leq 1:1$, or produce imprecise via-hole dimensions, and have exhibited low yields of acceptable micro-via patterns. This invention overcomes these problems by providing a high-throughput system that is capable of drilling high-quality patterns of high-aspect-ratio via-holes.

SUMMARY OF THE INVENTION

The object of the invention is to provide a novel mask-controlled laser via-drilling system which can simultaneously drill a large number of high-quality via-holes in a micro-via pattern, with exceptional precision, speed and economy.

Another object of the invention is to multiplex a high-power laser into multiple beamlines to drill several very high quality micro-via patterns simultaneously, using a mask for via-hole definition for each micro-via pattern, and using a set of projection optics to precisely image each of the micro-via patterns.

A feature of the invention is the provision of a novel beam divider for efficiently separating the laser beam, after homogenization and beam-shaping, into a number of separate sub-beams for delivery of drilling pulses to a multiplicity of micro-via pattern drilling beamlines simultaneously.

An advantage of the invention is its modularity in two dimensions, functional and vertical, which allows the user to retool quickly, to increase the throughput of the system by dividing the laser beam into additional sub-beams to supply additional beamlines, and also allows the user to add additional beamline subassemblies, each beamline subassembly containing its own mask hardware and projection optics.

Another advantage of the invention is that the above modularity permits a soft tooling approach to demonstrate the feasibility of a mass production program through the use of a pilot system and also through the use of an easily-changeable production system—without the cost and risk of investing early in hard tooling.

Another advantage of the invention is that a very powerful excimer laser may be used economically to drill a great number of very precise via-holes, because a multiplicity of such holes is drilled simultaneously by each of several sub-beams to provide a multi-hole via-drilling pattern for each of the several beamlines. This permits, for example, the simultaneous drilling of five or more identical, or differing, patterns of one thousand via-holes each, as controlled by an equal number of identical, or differing, patterns in a mask or set of masks.

Still another advantage of the invention is that the precision resulting from the use of masked projection lithography is combined with high-repetition presentation of the substrate for very high-speed, very-high-precision micro-via-pattern drilling at low cost for high production volumes.

Other objects, features and advantages of the invention will be apparent from the following written description, claims, abstract and the annexed drawings.

DESCRIPTION OF THE PREFERRED EMBODIMENTS

Figure 1:
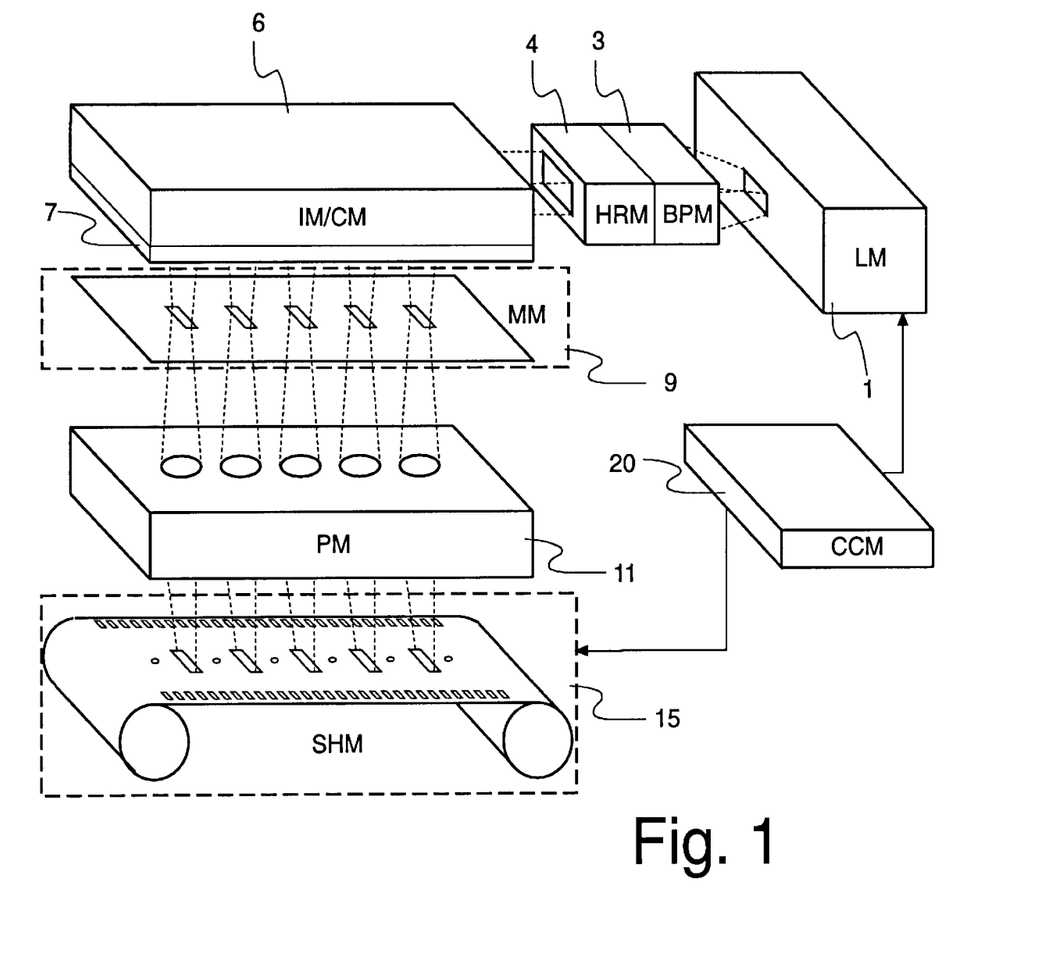
FIG. 1 is a semi-schematic view of a multiplexed version of the preferred embodiment, shown as in use to simultaneously drill five mask-controlled multi-hole via-patterns in a substrate, each via-pattern having an array of micro-vias corresponding to the via-pattern of its related mask.
Figure 2:
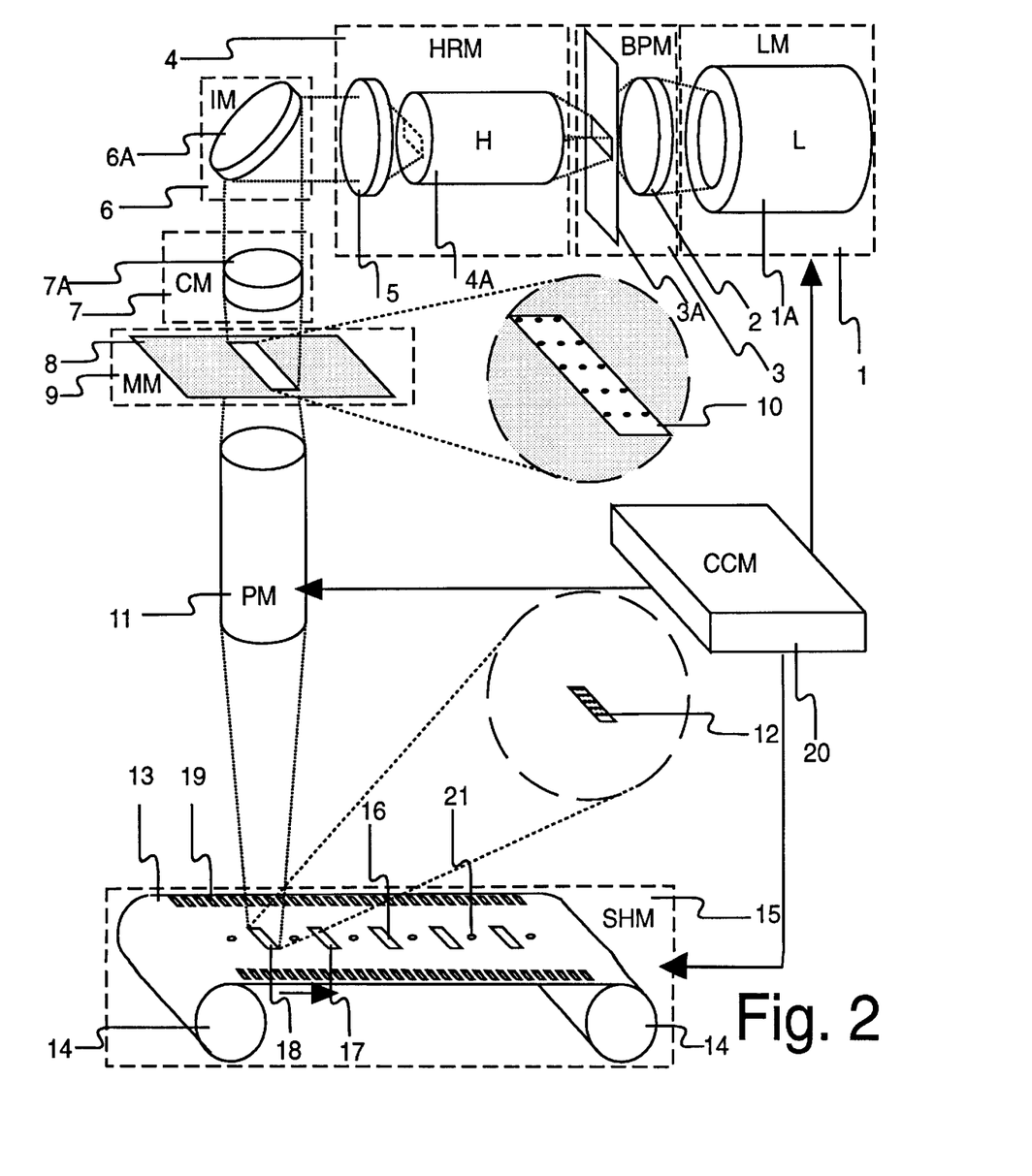
FIG. 2 is a semi-schematic view of a simplified version of the preferred embodiment, a pilot system without laser beam multiplexing, shown as in use.

FIGS. 1 and 2 should be considered together in the next few paragraphs, for a general understanding of the invention.

FIG. 1 illustrates a preferred embodiment of the invention in form of a production system, with multiplexing of the laser beam in order to drill a number of micro-via patterns simultaneously, each micro-via pattern including a multiplicity of via-holes.

FIG. 2 illustrates a simplified preferred embodiment of the invention, without multiplexing. FIG. 2 shows modules and included items marked by reference characters 1–20. Both FIGS. 1 and 2 show the various modules, including the following:

| laser module | LM | 1 |
| beam processing module | BPM | 3 |
| homogenizer/recollimator module | HRM | 4 |
| illumination module | IM | 6 |
| condenser module | CM | 7 |
| mask module | MM | 9 |
| projection module | PM | 11 |
| substrate handling module. | SHM | 15 |
| central control module | CCM | 20 |

The details of FIG. 1 will be described in subsequent sections, after a more convenient discussion of details based upon the simplified version of FIG. 2. FIG. 2 shows a simplified embodiment, referred to as a pilot system, which has significant utility in itself as a soft tooling approach to early production or to short production runs. Its simplicity and its capability of operating with a relatively inexpensive medium-power laser make it economical in such a soft-tooling approach. The pilot system embodiment in FIG. 2 is shown configured for a single beamline, without multiplexing of the laser beam. This embodiment shall be described first.

Referring to FIG. 2, illumination is provided by a medium-power laser module LM 1. Laser module LM 1 preferably comprises a pulsed excimer laser 1A, which provides a powerful output beam of pre-defined cross-section and divergence. The laser beam passes to beam-processing module BPM 3 where it is captured by condensing lens 2 and further processed by beam shaper 3A. The shaped beam exits BPM 3 and enters homogenizer/recollimator module 4. The beam processing module 3 and homogenizer/recollimator module 4 are preferably configured for optimal coverage of the anticipated mask patterns, which as shown are rectangular. In addition, beam processing module 3 sets the numerical aperture that will be used to illuminate the mask, and determines how the laser beam couples into the down-stream projection optics. The homogenizer 4A is a reflective-type system that serves to uniformize the beam while preserving the numerical aperture determined by the beam processing module 3. Such homogenizer is described in U.S. Pat. No. 5,059,013, ILLUMINATION SYSTEM TO PRODUCE SELF-LUMINOUS LIGHT BEAM OF SELECTED CROSS-SECTION, UNIFORM INTENSITY AND SELECTED NUMERICAL APERTURE, Jain, issued Oct. 22, 1991.

The shaped laser output beam which emerges from homogenizer 4A is collimated by recollimating lens 5, exits homogenizer module 4 and enters an illumination module 6. The illumination module 6 in FIG. 2 is shown as simply a 100% reflective fold mirror 6A. For the multiplexed function, the illumination module 6 will be more complex, as will be explained in detail infra. In the multiplexed case, the illumination module 6 reconfigures the beam for multiplexing into individual beamlines. No reconfiguration is shown in FIG. 2 with its single beamline The light is then directed along the appropriate beamline (one beamline shown in FIG. 2) into condenser module 7. The light beam is then directed by lens 7A of condenser module 7 onto mask module MM 9. The beam 10, patterned according to via-pattern 8 in mask 9, then enters projection module PM 11, which provides appropriate reduction (typically 2:1 or 5:1) to the final via-drilling pattern beam 12, which is applied to substrate 13. Substrate 13 is fed by rolls 14 in substrate handling module (SHM) 15. Final via-drilling pattern beam 12, as shown in FIG. 2, has already drilled via-patterns 16 and 17, and is shown in the act of drilling via-holes of via-pattern 18 in the substrate 13. Substrate 13 is fed by an intermittent drive, such as a movie-projector drive mechanism (not shown) using sprocket holes 19, so as to feed the substrate 13 under strict control by central control module CCM 20, with intermittent stops for drilling with the substrate temporarily halted. Central control module 20 controls laser pulse timing and the number of pulses for each via-pattern, and controls the substrate handling module 15 for proper presentation of substrate segments for accepting the via-drilling patterns. Central control module 20 may also manage adjustments of the other modules, as desired, and with the addition of appropriate mask feed devices (not shown in FIG. 2) may control mask selection.

SUMMARY OF PILOT SYSTEM

The pilot system, shown in FIG. 2, accomplishes the drilling of multiple via-holes in a mask-controlled via-pattern, in a via-pattern segment of a substrate presented with an intermittent stop at an imaging station. Laser power from laser module LM 1 is processed by a beam processing module BPM 3 and homogenizer/recollimator module 4, resulting in a shaped beam of self-luminous high-fluence laser energy applied to an illumination module IM 6 The illumination module reconfigures and redirects the beam into an assigned set of beamline subassemblies (one shown) each having projection optics, a mounted mask, and reduction optics, so as to project the selected via-drilling pattern onto the substrate for drilling at an imaging station for the beamline. A substrate handling module positions the appropriate substrate segment, aligned to the assigned beamline at the appropriate imaging station. A control module CCM 20 applies overall management.

OPERATION OF LOW-COST VIA-DRILLING PILOT SYSTEM

FIG. 2 shows a schematic of the low-cost via-drilling pilot system. The laser output is directed, after appropriate processing by beam processing module 3 and homogenizer/recollimator module 4, to an illumination module 6 which reconfigures the laser beam into a set of uniformized sub-beams (one shown in FIG. 2) each with the desired shape (as shown, rectangular) and with a uniform intensity which is constant across the rectangular profile. This profile is projected onto the mask with a suitable numerical aperture that is matched to the imaging system. The rectangular illumination beam is tailored so that it just overfills the nozzle via-pattern 8 on the mask. This maximizes the efficiency of the laser output power so that little energy is wasted on illuminating any mask area not containing a via-pattern. Non-pattern areas of the mask are generally reflective, and under certain circumstances the reflected beam portions may be recycled.

The mask itself may contain a replicated nozzle design via-pattern, or may contain many different nozzle design via-patterns, any one of which may be selected for imaging by translating the mask such that the desired nozzle design via-pattern is illuminated by the uniformized sub-beam. The mask may be considered a "mask set" with many forms, including a single mask strip with replicated patterns, a single mask strip with different patterns, or a set of individual-pattern masks suitable arrayed in a mask carrier of appropriate design. The mask patterns may take various forms, including the form of a stencil in a metal sheet, the form of reflective regions produced on a transparent substrate, or the form of opaque regions produced on a transparent substrate.

Each of the masks thus illuminated is imaged by a projection lens which reduces the object field by a certain factor, typically between 2 and 5. This feature offers two key advantages: the fluence at the mask is minimized, which increases the mask lifetime; and the design of the mask becomes easier since the via-dimensions on the mask can be twice (or five times) as large as the via-dimensions required at the substrate. For example, in one application with such a 2× reduction system, the via-hole sizes that are required at the mask are 16 μm in diameter. Masks of such feature sizes are easily within the capabilities of most mask houses.

The substrate, commonly a polyimide film, is placed at the image plane of the projection lens and is stationary during the exposure. The exposure lasts approximately 2 seconds, after which the substrate film is indexed to expose the next set of nozzle blanks. The exact patterning rate will depend on a number of factors, including nozzle design, substrate material and substrate thickness.

We will now describe in more detail each of the sub-system modules for the pilot system:

Laser Module

Suitable examples of the laser 1A for the pilot system illustrated in FIG. 2 are a Lumonics Pulsemaster 848 excimer laser system and a Lambda Physik LPX laser, each with an emission wavelength of 308 nm. The laser has an average power output of approximately 50 W or more, with a repetition rate of 200–400 Hz. The beam dimensions are roughly 10 mm×25 mm and the pulse duration is 12–20 ns.

These lasers use a microprocessor-based central control module CCM 20, which may come in the form of a hand-held "palmtop" remote control unit (RCU) which connects to the laser via an umbilical cable, or it may be part of a computer system. All the functions of the laser, including output power, stabilization, trigger rate, and gas refilling, may be operated from the RCU or the computer. This greatly facilitates integration of the laser with other subsystems.

Beam Shaping Module

The beam processing module 3 couples the beam directly from the laser module 1 into the homogenizer/recollimator module 4. It determines the numerical aperture that is used to illuminate the mask, and determines how the laser beam couples into the projection lens. The module comprises a focusing lens 2 and a beam-shaping aperture 3A.

Homogenizer/Recollimator Module

The homogenizer/recollimator module 4 includes two distinct subassemblies, as follows:

the homogenizer 4A; and a collimating lens 5.

The preferred homogenizer 4A is a reflective-type kaleidoscopic device, which serves to uniformize the laser beam and provide self-luminous radiation preferred for imaging the via-drilling pattern while preserving the numerical aperture determined by the beam shaping system. The preferred homogenizer 4A comprises a light tunnel which has a polygonal cross-section, is constructed of mirror strips with internally reflecting surfaces, and serves to uniformize the input beam by multiple internal reflections. In the embodiments shown, the preferred polygonal cross-section is rectangular. The design maximizes the number of internal reflections while minimizing the overall system length. For further details, see U.S. Pat. No. 5,059,013, ILLUMINATION SYSTEM TO PRODUCE SELF-LUMINOUS LIGHT BEAM OF SELECTED CROSS-SECTION, UNIFORM INTENSITY AND SELECTED NUMERICAL APERTURE, Jain, issued Oct. 22, 1991. The homogenizer 4A accepts the radiation beam from the beam processing module 3. The homogenizer 4A output is nominally recollimated by near-collimating lens 5. The shaped, homogenized, radiation output of the homogenizing and recollimating module 4 passes to the illumination module 6.

Illumination Module

The illumination module 6 has two distinct functions, as follows:

reconfiguration into the desired number of sub-beams; and beam redirection.

The illumination module 6 is typically a beam-splitter, or partially reflective mirror system, which reconfigures and redirects the radiation output of the homogenizing and recollimating module 4 onto the mask module 9 as a set of sub-beams, one for each beamline. The beam redirection system may be as simple as a fold mirror 6A (one-beamline pilot system) or may be much more complex, as the number of beamlines is increased. Explanation of various embodiments of the illumination module will be explained in detail infra, under headings Echelon-Mirror Illumination Module, Multiple-Mirror Illumination Module, and Flat-Mirror Illumination Module.

Condenser Module

The function of the condenser module 7 is to focus the beamline sub-beams onto the related mask segments in the mask module 9.

Mask Module

The function of the mask module 9 is to position an appropriate set of via-pattern mask segments for patterning of the sub-beams in each of the beamlines. As detailed above, the mask itself may contain, for an aerosol nozzle design, a replicated nozzle design via-pattern. Alternatively, it may contain many different nozzle design via-patterns. The via-pattern is selected for imaging by translating the mask to a position such that the desired nozzle design via-pattern is illuminated by the selected uniformized sub-beam. The mask may be considered a "mask set" with many forms including a single mask strip with replicated pattern, a single mask strip with different patterns, or a set of individual-pattern masks suitably arrayed in a mask carrier of appropriate design.

Projection Module

The projection module 11 in the preferred embodiments is a 2:1 reduction projection lens assembly, which images the selected micro-via pattern (e.g., nozzle via-pattern) from the mask onto the polyimide film substrate 13. Since the largest dimension of the nozzle on the image field may be on the order of 5 mm, it is possible to build a low-cost projection system which need only consist of 2–3 lens elements. A suitable reduction lens that is well-suited for this application consists of two fused-silica elements that are AR-coated for the laser wavelength of 308 nm. The image field is 6 mm diameter and the numerical aperture is 0.02 in image space. The overall distance from object to image is 475 mm.

This is a very rugged, low-cost lens sub-module to fabricate. Many such sub-modules can be easily fabricated and integrated into the via-drilling system at a low cost. The simplicity of the projection system is important in a low-cost via-drilling system.

Substrate Handling Module

The substrate handling module 15 allows the user to advance the substrate (polyimide film shown) to bring the next set of nozzle blank segments of the polyimide film into alignment for exposure. A simple manual alignment system will ensure that the nozzle blank segment is adequately registered with respect to the sprocket holes 19, or other alignment pattern, such as alignment spots 21 or alignment holes on the Polyimide film 13. Clearly, automatic pattern alignment mechanisms may also be used as desired.

Scaling Up—Via-Drilling Pilot System/Production System

The pilot system laser has an output pulse energy which provides approximately ten times larger fluence than is typically needed for the laser-ablation drilling of the via-pattern of one nozzle. Since the illumination/mask/projection system is of such a simple, elegant design, it is possible to split off energy from the same laser to go through multiple condenser/mask/projection vertical subassemblies to generate via patterns in multiple nozzles simultaneously. Many beamlines can be added with incremental additional cost, since the laser energy is already available and the reduction lenses are of a simple low-cost design. It is possible to increase the patterning throughput from approximately 0.5 nozzles/second, for the single beamline system of FIG. 2, to $\geq 5$ nozzles/second for a ten-beamline system multiplexing the same laser ten ways, similar to the five-beamline version shown in FIG. 1.

The illumination module 6 in the scaled-up system is similar in function to that described above, with reference to FIG. 2 for the pilot system, with the difference that it includes additional elements in the illumination module 6, to divide the illumination beam into multiple sub-beams in related beamlines for illuminating the polyimide film substrate at multiple nozzle blank locations, through multiple masks or mask segments. Depending on the number and the configuration of beamlines that are chosen, one multiple via-pattern mask, or a plurality of masks, are used.

The condenser module 7 may consist of an integrated array of condenser lenses which are simultaneously used to illuminate the mask nozzle patterns on the mask module 9. An individual lens assembly in this condenser module is very similar to that described with respect to FIG. 2. An alternative array of condenser lenses may be incorporated in a different modularity, the vertical subassembly to be shown in FIG. 6 and described infra in the section under subhead "Vertical Subassembly Modularization."

The substrate handling module 15 is preferably automated, to reposition the polyimide film to bring the next set of segments into the image field for exposure. The substrate handling module 15 has many of the characteristics of a movie projector, moving the polyimide film 13 from a supply reel to a take-up reel, with a stop at the processing station. Reel feed is on a demand basis; buffering loops allow for minor differences of reel feed speed and also allow for the temporary stop at the processing station. Sprocket holes 19 in the polyimide film 13 allow simple automatic alignment procedures to be used to ensure that the images are properly registered, within tolerances which are not excessively tight, for location of the via-pattern within the substrate segment.

A CENTRAL CONTROL MODULE 20 synchronizes the firing of the predetermined number of laser pulses with the temporary halts during advancement of the polyimide film. This central control system may be a standard personal computer, which may utilize a standard RS-232 interface for communication with the laser system.

High-Throughput Via-Drilling Production System

The embodiment of the invention for a high-throughput via-drilling production system is similar to the design of the pilot system except that it utilizes an industrialized, high-powered excimer laser such as the LP 3308 from Lambda Physik. This excimer laser is a 3000 series industrialized system with output wavelength at 308 nm. It can produce 150 W of output power at 300 Hz repetition rate. The laser system is controlled via a LAN fiber optic data ring and PC controller which maintains a history and logbook file. The system also has control capability using RS-232 interfacing and modem support.

The laser pulse energy is 500 mJ during stabilized operation at 300 Hz. This makes it possible to simultaneously feed up to 20 beamlines and generate up to 20 nozzle patterns simultaneously in an exposure time as short as 1.33 seconds. This translates to a throughput of approximately 10–15 nozzles per second, depending upon film delivery time by substrate handling module SHM 15.

Echelon-Mirror Illumination Module

Figure 3:
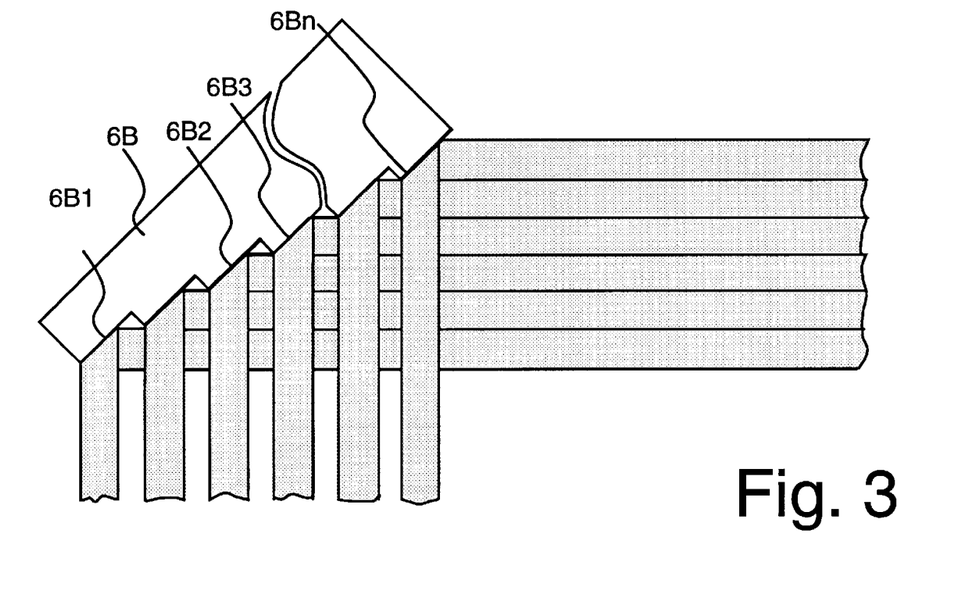
FIG. 3 is a side elevation view of an illumination module employing a single-block echelon mirror, shown semi-schematically in use.

FIG. 3 shows the single-block multiple fold mirror illumination module 6B. Individual mirror segments 6B1–6Bn are set back while retaining the same angle. The radiation bypasses the small passive area between mirror segments. The radiation is thus divided into a number of sub-beams, to strike the condenser system as spaced beamlines require. The single block is preferably of quartz, with faces ground parallel, mirror-finished and high-reflectivity-coated, to feed a beamline with each mirror face. The single-block mirror may be positioned in a simple bracket, with a set of positioning screws for alignment to the related set of beamline optics.

Multiple-Mirror Illumination Module

Figure 4:
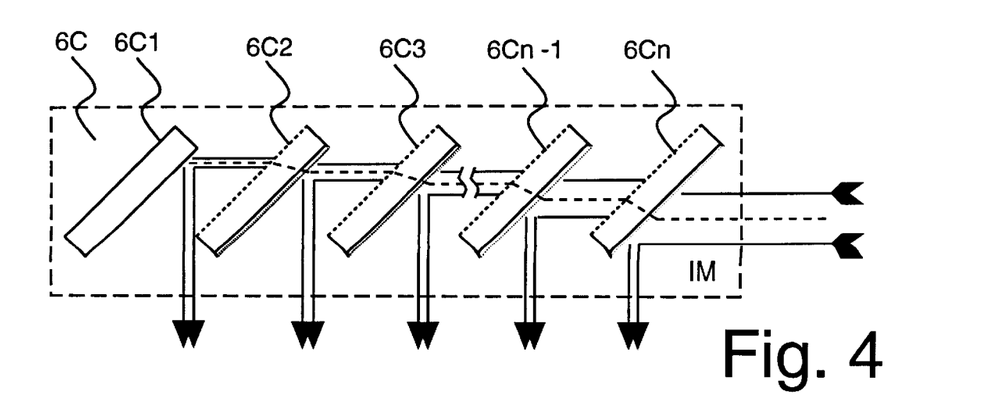
FIG. 4 is a side elevation view of a diminishing-reflectivity beam-splitter mirror illumination module, shown semi-schematically in use.

FIG. 4 shows an alternative illumination module comprising a series of angled mirrors 6C1–6Cn, capable of dividing the input beam into a set of sub-beams of equal intensity. For this purpose, the mirrors have different degrees of reflectivity, depending upon position n, following the formula:

$$\text{Mirror}(n)\text{Reflectivity}=1/n\times 100\%,$$

where n rises from most distant, to least distant, with respect to the light source.

The rear surface of each mirror, with the exception of 100%-reflectivity mirror 1, is anti-reflection coated.

The mirrors are positioned, one after another, in the path of the output beam from the homogenizer/recollimator module 4, so that each mirror reflects a fraction of the incident beam toward the mask. The remaining fraction of radiation that is not reflected by a given mirror travels through to the mirror behind it, until the radiation reaches the most distant mirror, which is 100% reflective.

FIG. 4 is used to illustrate and clarify how the mirrors function. The illumination module shown comprises a series of five angled mirrors 6C1–6C5. If the mirrors are to divide the input beam into five sub-beams of equal intensity, then they must each reflect 20% (100%/(n=5)) of the input beam toward the mask. To accomplish such a result, mirror 6C5 must be (100%/n)=20% reflective. After 20% of the input radiation is reflected toward the mask, the remaining 80% travels through mirror 6C5 to mirror 6C4. In order for mirror 6C4 to reflect 20% of the initial input beam toward the mask, mirror 6C4 must be 25% reflective (25% of 80%=20%). The remaining fraction of the beam that travels through mirror 6C4 is 60% (=80%–20%) of the initial input beam. The 60% is incident upon mirror 6C3, which is 33⅓% reflective in order to reflect 20% (=33⅓% of 60%) of the initial input beam toward the mask. Continuing the series, 40% (=60%–20%) of the input beam is incident upon mirror 6C2 (not shown) which is 50% reflective. Mirror 6C2 reflects 20% (=50% of 40%) of the input beam toward the mask, and the remaining radiation, 20% of the input beam, passes through to mirror 6C1. Mirror 6C1 is 100% reflective, so that the remaining 20% of the input beam that is incident upon it is reflected toward the mask. FIG. 4 shows beam intensity changes as if they were beam dimension changes, for clarity of understanding, even though the actual beam dimensions are unchanged. As already stated above, when n mirrors are used to divide the input beam into n sub-beams of equal intensity, mirrors n through 1 have increasing degrees of partial reflectivity, according to the formula:

Reflectivity of Mirror $n=(1/n)\times 100\%$, where n increases toward the beam source. Thus, if one decides to reconfigure this embodiment of the invention to have more or fewer mirrors, the mirrors that are already in place do not have to be changed, because their reflectivities stay the same by virtue of the positions they occupy in the series 6C1 ... 6Cn.

While generally preferred, it is not necessary for the sub-beams to be matched, in which case the various mirrors must be selected to provide the selected beam division into the various beamlines.

Flat-Mirror Illumination Module

Figure 5:
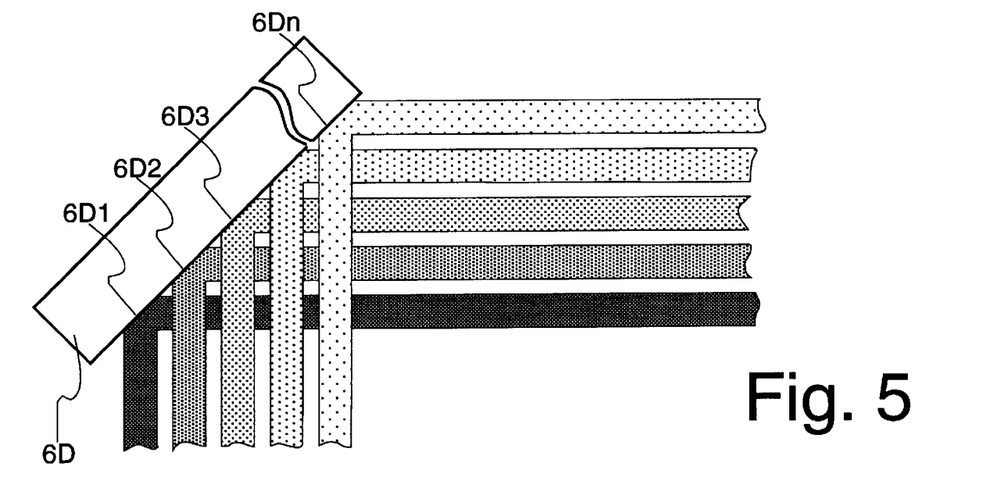
FIG. 5 is a side elevation view of a flat single-mirror beam-splitter illumination module, shown semi-schematically in use.

FIG. 5 shows a flat-mirror illumination module 6D. In theory, it is possible to use a flat fold-mirror to redirect the shaped, homogenized laser beam output of the laser module 1 to one or a plurality of beamlines, using an arrangement of beam blocking regions to block light between mirror portions 6D1–6Dn, which reflect the multiple beamlines if multiple beamlines are used. In this arrangement, the light blocked by the beam blocks is wasted. Therefore, the first two embodiments of the illumination module are more desirable.

VERTICAL SUBASSEMBLY MODULARIZATION

Figure 6:
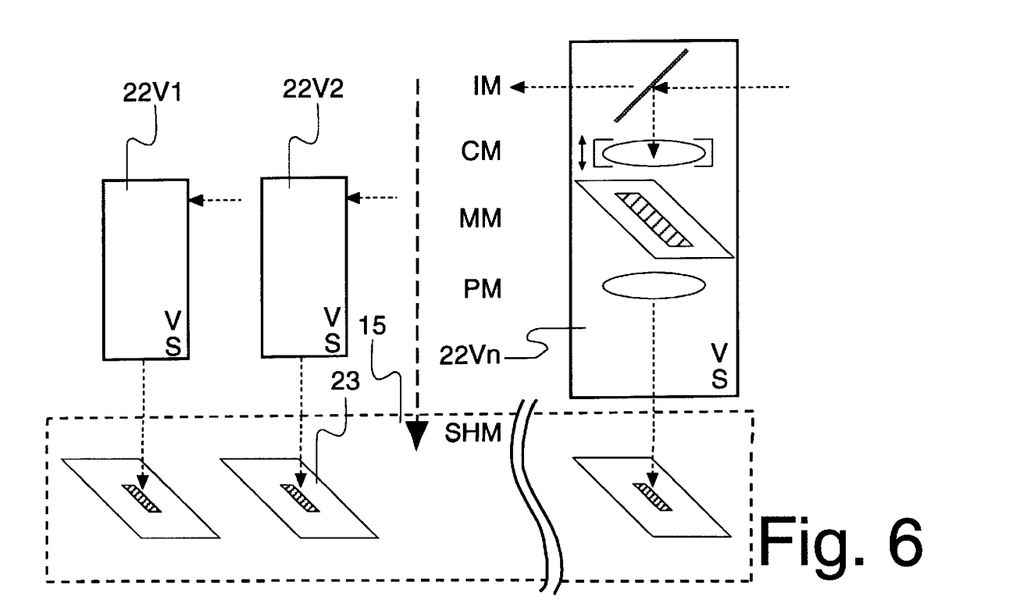
FIG. 6 is a partially cutaway schematic perspective view of a representative vertical beamline subassembly, including a small portion each of the functions illumination, condensing, masking and projection.

FIG. 6 shows how modularization may be implemented in the vertical dimension, by replicating a set of multi-function vertical subassemblies 22V1–22Vn, each vertical subassembly including the functions CM; MM and PM—for the individual beamline of n beamlines. This multidimensional modularity permits quick and inexpensive scale-up without a great deal of redesign. The vertical subassemblies are identical in most functions. Adjustment of the focus of the condenser lens is made available, to adjust for the slightly differing distances from the radiation source.

The vertical subassemblies may also be made to include the beam splitter mirror (illumination module) function, to differ in the reflectivity of the individual mirror as already described, following the formula:

Reflectivity of Mirror $n=100\%/n$, where n is position number increasing toward the radiation source.

The different subassemblies may also have different specifications for the condenser lenses in CONDENSER MODULE 7. For example, the lens in vertical subassembly 22V2 may have a slightly different focal length, or position, or both, than the condenser lens in vertical subassembly 22V1; thus is done to account for the difference in the path lengths from the homogenizer to the different condenser lenses. Note that an increase in the number of vertical subassemblies does not require any change in the vertical subassemblies already in place, if the beamlines are to be matched and the additional vertical subassemblies are installed nearest the radiation source. As shown in FIG. 6, vertical subassemblies 22V1, 22V2 and 22V3 remain the same whether n=3, n=4 or n>4.

Figure 8:
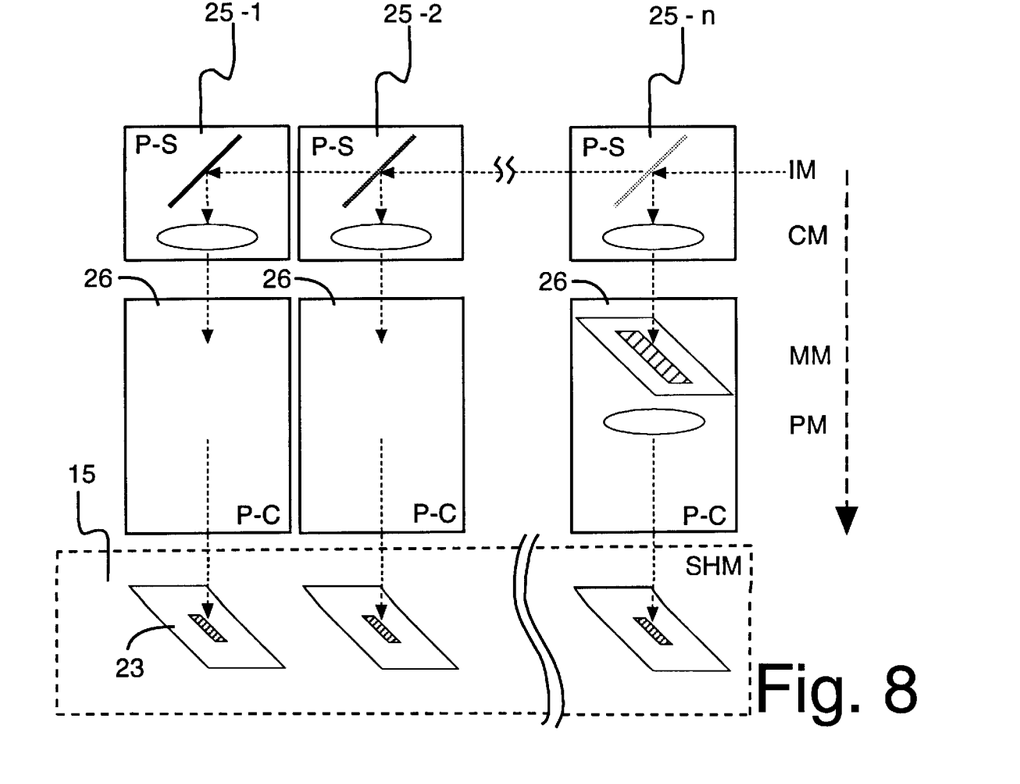
FIG. 8 is a partially cutaway schematic perspective view of a representative multiple-beamline set of sub-subassemblies, including for each beamline a position-specific sub-subassembly with the functions illumination and condensing, and for each beamline a position-common sub-subassembly with the functions masking and projection.

It may be desirable for all the vertical subassemblies 22Vn to be identical, for inventory and manufacturing convenience. Accordingly, in an alternate embodiment, the condenser lenses in each vertical subassembly may be provided with translational capability to adjust the position for focus onto the mask. Under certain circumstances, it may be desirable to modularize by packaging the various partially-reflective mirrors (see FIG. 8) together with a related condenser lens in matchable sets of position-specific and position-common vertical sub-subassemblies. Each such position-specific vertical sub-subassembly 25-1 ... 25n must differ according to beamline assignment 1 ... n, because of reflectivity considerations specific to the particular beamline, so it is reasonable to package each such mirror together with the condenser lens of appropriate location and focal length for that beamline. Conversely, it is reasonable to package together, in a single sub-subassembly, position common mask/projection functions in identical parts P-C 26 for use in the various beamline positions.

Figure 9:
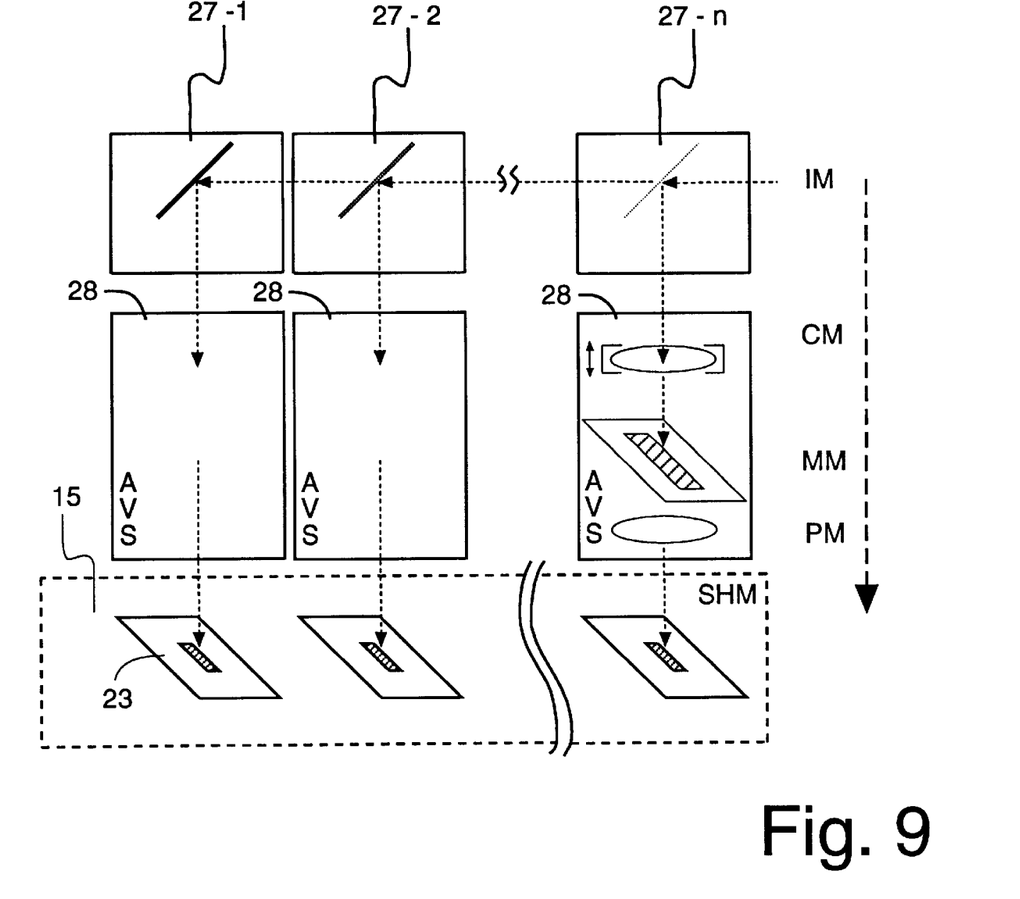
FIG. 9 is a partially cutaway schematic perspective view of a representative multiple-beamline set of sub-subassemblies, including for each beamline a position-specific sub-subassembly with the functions illumination, and for each beamline a position-common sub-subassembly with the functions condensing, masking and projection.

FIG. 9 illustrates a different modularization, in which the illumination function may be packaged as separate sub-subassemblies 27-1 ... 27n in a position-specific manner or as a complete module, with each beamline to be equipped with a special vertical subassembly AVS 28 which has functions condensing, masking and projection. The condenser lens is adjustable to provide focus onto the mask, regardless of changes to optical path length related to beamline position, so the single part design can work for any beamline position.

Substrate Handling Module

The substrate handling module SHM 15 may take a great number of forms, and preferably is modular, as is the rest of the system. The function is to transport a set of substrate segment blanks to the imaging station, and temporarily hold the blank in position for via-pattern-drilling, as required by the system. The substrate may be in form of a film, as shown. Alternatively, a belt may be used to carry individual substrates, or substrate wafers may be individually fed. The basic requirement is that there be no relative motion between the substrate and the beamlines during the via-drilling operation, and that there be a continuous supply of substrate blanks for processing.

Production System

The preferred embodiment of the invention, referred to here as a production system, is illustrated by the semi-schematic view in FIG. 1. This embodiment of the invention features multiplexing the treated, homogenized laser beam in order to drill n (five shown) mask-controlled multi-hole via-patterns in a substrate. This embodiment of the invention comprises all the elements shown in FIG. 2, some with internal details omitted, and differs primarily in that it shows a multiplexed set of beamlines.

FIG. 1 shows without detail the laser module LM 1, the beam processing module BPM 2, the homogenizer/recollimator module HRM 4, the condenser module CM 7 and the projection module PM 11. Condenser module CM 7 is shown in a dual box with illumination module IM 6, which is multiplexed and has been explained, in three versions and one additional packaging technique using vertical subassemblies, in FIGS. 3–6.

The shaped laser beam, after it exits the homogenizer/recollimator module HRM 4, enters illumination module 6 which comprises elements to divide the illumination beam into multiple sub-beams (five sub-beams shown). The sub-beams illuminate the mask patterns 8 on mask module MM 9. The multiple sub-beams are suitably configured by condenser module 7, which comprises an integrated array of lenses used to direct the homogenizer sub-beams simultaneously onto the mask module 9. The mask patterns 8 are imaged by projection module 11 onto the substrate film 13. The substrate handling module SHM 15 is automated, to reposition the substrate film 13 to bring the next set of segments (such as segments duplicating via-patterns 16, 17 and 18) into the image field for exposure. The substrate handling module SHM 15 includes an automatic alignment mechanism under the direction of control module CCM 20 for ensuring proper registration of the images. Control module CCM 20 controls the functions of laser module LM 1 via a local area network (LAN) fiber optic data ring and a personal computer controller, which maintains a history and logbook file. Control module CCM 20 synchronizes the firing of a series of radiation pulses with the intermittent advancement and halting of the substrate film.

The invention will be described in use, optimized for producing useful products characterized by sets of via-holes in via-patterns with hole-configurations specialized for the individual product.

Use in Producing Aerosol Nozzle Structures

This use is optimized as a via-pattern drilling process for producing disposable aerosol nozzle structures, each having several hundred via-holes. The via-holes are nominally one-micron exit-aperture through-holes in Kapton (TM) polyimide film. The nozzle structure is useful, for example, for converting liquid nasal spray to an aerosol dose.

This use is first discussed as a high-throughput production system corresponding to FIG. 1; it is also discussed as a simplified pilot system corresponding to FIG. 2.

A 308 nm excimer laser, 400 pulses/sec with a fluence of 300 mJ/cm$^2$/pulse, is optimized to drill one-micron holes through a 25 $\mu$m thickness polyimide film. The holes are approximately 8 $\mu$m at the top of the film and 1 $\mu$m at the bottom, of uniform size and shape, throughout the entire nozzle array, numbering on the order of 1000 via-holes.

It is convenient to review the advantages of both the pilot system and the production system in context of this use, as follows:

1. The laser power of laser module LM 1 is adequate to ablate a multiplicity of holes in each of a plurality of nozzle blanks—simultaneously;
2. The lens subsystems, of the condenser module 7 and the projection module 11, are very simple, rugged, and very modular, with individual lens sub-modules (or, alternatively, condenser lens/mask/projection lens subassemblies) being very inexpensive to manufacture and assemble into scaled-up arrays for drilling multiple via-holes simultaneously;
3. The illumination module IM 6 is likewise rugged and capable of being easily scaled up for an increased number of beamlines; and
4. The substrate handling module SHM 15 is simple, and modular so as to be easily adjusted, or easily replaced, and thus may be easily optimized to feed a variety of particular types of substrates, without costly retooling delays.

These combined features allow increasing the throughput of the pilot system by adding additional beamlines from the same laser, where each beamline contains its own portion of the illumination module and its own condenser optics, mask segment, and projection optics.

Note that projection optics, while usually recommended as a 2:1 reduction system, may be changed from >1:1 to 1:1 or to <1:1 as desired, or may in some cases even be simply omitted.

Process and Product-by-Process

Figure 7:
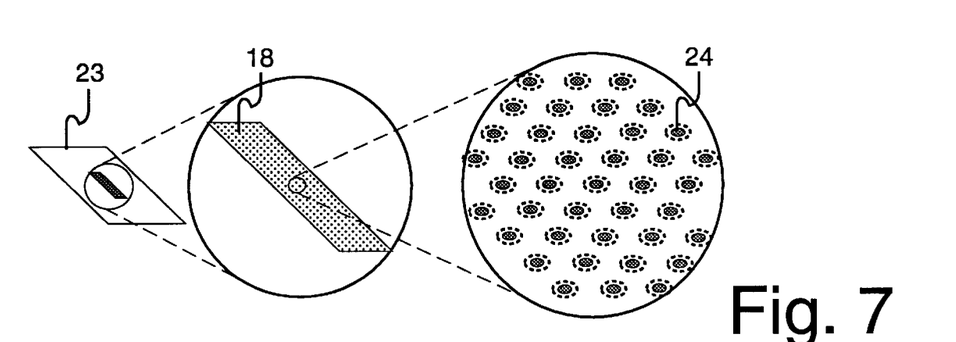
FIG. 7 is a semischematic perspective view, with a segment shown separately as two levels of enlarged detail, of a representative product with a via-pattern drilled according to the process.

FIG. 7 shows a representative multi-hole via-pattern in a nozzle structure for aerosols, as produced by the process. The process results in an economical, high-quality via-patterned nozzle blank 23, having a via-pattern 18. Note the representative via-holes 24 shown enlarged but not exactly to scale, with the dashed outline being the entry hole and the shaded circle being the exit hole, of the individual via-holes produced by the process. The nozzle structure, produced by the process of drilling micro-vias in a substrate according to a set of related masks, is characterized by the following steps:

(Step 1) Providing a laser module 1 having sufficient power to perform simultaneous via-hole-drilling of a large number of via-holes;

(Step 2) Arranging a beam processing module 3 to accept the beam output of said LASER MODULE 1 and forward a shaped beam with a selected numerical aperture;

(Step 3) Arranging a homogenizing and recollimating module 4 to accept the beam output of said beam processing module 3 and forward a shaped, nearly collimated beam;

(Step 4) Arranging an illumination module 6 to accept the beam output of said homogenizing and recollimating module 4 and to reconfigure the beam output into a set of one or more sub-beams in an operational pattern;

(Step 5) Arranging a condenser module 7 to provide a set of one or more beamlines, each to accept a related sub-beam from said ILLUMINATION MODULE 6 and to provide a related set of sub-beams for illuminating a mask module 9;

(Step 6) Arranging a mask module 9 having a set of mask via-patterns to accept the sub-beam outputs of said CONDENSER MODULE 7 and to illuminate the set of mask patterns; and (Step 7) Arranging a PROJECTION MODULE 11 to accept and image the illuminated sub-beam the sub-beam via-patterns of said MASK MODULE 9 to provide a set of related sub-beams for via-drilling the mask patterns on a substrate currently presented at a processing station.

While the invention has been shown and described in terms of a number of embodiments, with a number of suggested modifications for special needs, for a number of uses, it will be clear that further modifications and additional uses are possible.

We claim:

1. A multiple-via-hole via-pattern drilling system, having a substrate delivery subsystem for presenting a set of substrate segments at a processing station, and for carrying away each substrate segment set after processing, characterized by:

a) a laser module (1) arranged generally in operational proximity to said processing station, being operational to produce a powerful beam output of pulses;

b) a beam processing module (3) arranged to accept the beam output of said laser module (1) and forward a shaped beam with the selected numerical aperture;

c) a homogenizing and recollimating module (4) arranged to accept the beam output of said beam processing module (3) and forward a shaped, uniform, and nearly collimated beam;

d) an illumination module (6) arranged to accept the beam output of said homogenizing and recollimating module (4) and to reconfigure the beam output into a set of sub-beams of predetermined characteristics in an operational pattern;

e) a condenser module (7) having a set of one or more condenser lens assemblies arranged each to accept a related sub-beam from said illumination module (6) and to illuminate a set of via-hole patterns;

f) a mask module (9), having said via-hole patterns arranged to accept the sub-beam outputs of said condensermodule (7); and g) a projection module (11) arranged to accept the sub-beam via-pattern outputs of said mask module (9) to provide a set of said related mask-patterned Imaging sub-beams for via-drilling a substrate currently presented at said processing station.

2. A multiple-via-hole via-pattern drilling system according to claim 1, wherein said illumination module (6) comprises an increasing-reflectivity set of mirrors 1 . . . n, to provide a set of sub-beams of predetermined characteristics, one sub-beam at each beamline of a set of beamlines, permitting a single laser of sufficient power to be multiplexed for the simultaneous drilling of a via-pattern of via-holes of predetermined characteristics in each beamline of said set of beamlines, according to the respective sub-beam characteristics and respective mask via-pattern, in the respective substrate blank.

3. A multiple-via-hole via-pattern drilling system according to claim 2, wherein said sub-beams are matched in intensity and said increasing-reflectivity subset of mirrors have reflectivity according to the following formula:

$$\text{Reflectivity} = 100\%/n,$$

where n is the mirror position number increasing toward the radiation source.

4. A multiple-via-hole via-pattern drilling system according to claim 1, wherein said illumination module (6) comprises an echelon configured to provide a subset of sub-beams of predetermined characteristics at each of a subset of beamlines, permitting a single laser to be multiplexed for the simultaneous drilling of a subset of via-holes of predetermined characteristics according to sub-beam characteristics and mask characteristics.

5. A multiple via-hole via-pattern drilling system according to claim 4, wherein said echelon mirror is configured with a finite number of angled facets interspersed with passive flats, and said single laser output is homogenized and supplied as a rectangular-cross-section beam such that equal portions of the beam impinge on each angled facet equally.

6. A multiple via-hole via-pattern drilling system according to claim 4, wherein said illumination module (6) comprises an echelon mirror (6B) configured with a finite number of angled facets interspersed with passive flats, and said single laser output is homogenized and supplied as a rectangular-cross-section beam to impinge on each of said angled facets appropriately to supply the related beamline with the selected optical sub-beam.

7. A multiple via-hole via-pattern drilling system according to claim 1, wherein said illumination module (6) comprises a single flat mirror and said single laser output is homogenized and is configured by a set of beam-blocking apertures so as to provide a subset of sub-beams of predetermined characteristics for each of a subset of beamlines.

8. A multiple via-hole via-pattern drilling system according to claim 1, wherein the predetermined characteristics of the sub-beams produced by said illumination module (6) are identical in each beamline.

9. A multiple via-hole via-pattern drilling system according to claim 1, wherein the predetermined characteristics of the sub-beams produced by said illumination module (6) differ in at least one beamline.

10. A multiple via-hole via-pattern drilling system according to claim 1, wherein said homogenizer comprises a light tunnel which has a polygonal cross-section, is constructed of mirror strips with internally reflecting surfaces, serves to uniformize an input beam by multiple internal reflections and preserves the numerical aperture of the light beam.

11. A multiple via-hole via-pattern drilling system according to claim 10, wherein said homogenizer light tunnel is rectangular in cross-section.

12. A multiple via-hole via-pattern drilling system according to claim 1, wherein said mask module comprises a mask pattern made in the form of reflective regions on a transparent substrate.

13. A multiple via-hole via-pattern drilling system according to claim 1, wherein said mask module comprises a mask pattern made in the form of opaque regions on a transparent substrate.

14. A multiple via-hole via-pattern drilling system according to claim 1, wherein said mask module comprises a mask pattern made in the form of a stencil in a metal sheet.

15. A vertical condenser/mask/projection sub-subassembly, for use in any one of a set of beamline positions in a mask-patterned laser via-drilling system, comprising:

adjustable condenser lens means, for focusing an input sub-beam at a mask position despite upstream optical path length difference related to position;

mask pattern means (9) appropriately positioned for receiving a related sub-beam from a related illumination module; and projection means (11);

which mask pattern means and projection means are arranged to provide, in combination, via-pattern drilling means for the assigned beamline.

16. A method of drilling micro-vias in a substrate according to a set of related masks, characterized by the following steps:

(Step 1) Allocating a laser module (1) having sufficient power to perform simultaneous via-hole-drilling of a large number of via-holes;

(Step 2) Arranging a beam processing module (3) to accept the beam output of said (1) and forward a shaped beam with the selected numerical aperture;

(Step 3) Arranging a homogenizing and recollimatina module (4) to accept the beam output of said beam processing module (3) and forward a shaped, collimated beam;

(Step 4) Arranging an illumination module (6) to accept the beam output of said homogenizing and recollimating module (4) and to reconfigure the beam output into a set of one or more sub-beams in an operational pattern;

(Step 5) Arranging a condenser module (7) having a set of one or more beamlines, each to accept a related sub-beam from said illumination module (6) and to provide a masked subset of said related sub-beams for drilling a substrate blank presented to a processing station;

(Step 6) Arranging a mask module (9) to accept the sub-beam outputs of said illumination module (6) and to pattern the sub-beam outputs into a set of one or more sub-beam via-patterns according to a set of masks; and (Step 7) Arranging a projection module (11) to accept the sub-beam via-pattern outputs of said mask module (9) to provide a set of said related mask-patterned sub-beams for via-drilling a substrate currently presented at a processing station.

17. An aerosol nozzle structure produced by a process of drilling micro-vias in a substrate according to a set of related masks, characterized by the following steps:

(Step 1) Allocating a laser module (1) having sufficient power to perform simultaneous via-hole-drilling of a large number of via-holes;

(Step 2) Arranging a beam processing module (3) to accept the beam output of said laser module (1) and forward a shaped beam with the selected numerical aperture;

(Step 3) Arranging a homogenizing and recollimating module (4) to accept the beam output of said beam processing module (3) and forward a shaped, collimated beam;

(Step 4) Arranging an illumination module (6) to accept the beam output of said homogenizing and recollimating module (4) and to reconfigure the beam output into a set of one or more sub-beams in an operational pattern;

(Step 5) Arranging a condenser module (7) having a set of one or more beamlines, each to accept a related sub-beam from said illumination module (6) and to provide a masked subset of said related sub-beams for drilling a substrate blank presented to a processing station;

(Step 6) Arranging a mask module (9) to accept the sub-beam outputs of said illumination module (6) and to pattern the sub-beam outputs into a set of sub-beam via-patterns according to a set of masks; and (Step 7) Arranging a projection module (11) to accept the sub-beam via-pattern outputs of said mask module (9) to provide a set of said related mask-patterned sub-beams for via-drilling a substrate currently presented at a processing station.

18. A via-patterned structure produced by a process of drilling micro-vias in a substrate according to a set of related masks, characterized by the following steps:

(Step 1) Allocating a laser module (1) having sufficient power to perform simultaneous via-hole-drilling of a large number of via-holes;

(Step 2) Arranging a beam processing module (3) to accept the beam output of said laser module (1) and forward a shaped beam with the selected numerical aperture;

(Step 3) Arranging a homogenizing and recollimating module (4) to accept the beam output of said beam processing module (3) and forward a shaped, collimated beam;

(Step 4) Arranging an illumination module (6) to accept the beam output of said homogenizing and recollimating module (4) and to reconfigure the beam output into a set of sub-beams in an operational pattern;

(Step 5) Arranging a condenser module (7) having a set of one or more beamlines, each to accept a related sub-beam from said illumination module (6) and to provide a masked subset of said related sub-beams for drilling a substrate blank presented to a processing station;

(Step 6) Arranging a mask module (9) to accept the sub-beam outputs of said illumination module (6) and to pattern the sub-beam outputs into a set of one or more sub-beam via-patterns according to a set of masks; and (Step 7) Arranging a projection module (11) to accept the sub-beam via-pattern outputs of said mask module (9) to provide a set of said related mask-patterned sub-beams for via-drilling a substrate currently presented at a processing station.

19. A vertical beam-splitter, condenser, mask and projection subassembly (22) for use in a mask-patterned laser via-drilling system, for installation optically downstream from a source of uniformized, shaped laser radiation, in an assigned beamline position in a set of beamline positions, for imaging a via-drilling pattern onto a substrate segment, characterized by:

partially reflective beam splitter mirror means, for dividing an input beam into a sub-beam at an assigned subassembly position, having upstream optical path reflectivity reductions related to upstream subassembly positions;

condenser lens means, for accepting said sub-beam from said beam splitter mirror means for the assigned position, and focusing said sub-beam, having focal length correction for upstream optical path length differences related to position, forward onto a mask position;

mask pattern means (9) appropriately positioned for receiving the said related sub-beam from said related condenser lens means; and projection means (11) appropriately positioned for receiving the said related sub-beam from said related mask pattern means, and imaging said related sub-beam, patterned by said related mask pattern means (9), onto a segment of the substrate at the imaging position of said substrate handling module;

whereby the vertical subassembly provides, for the assigned beamline, a via-drilling pattern to the substrate according to said mask pattern means.

20. A multiple-via-hole via-pattern drilling system, in which a substrate is temporarily presented for processing at a processing station, characterized by:

A) radiation delivery means (1–4) arranged in operational proximity to said processing station, being operational to produce a powerful beam output of pulses in the form of a shaped, uniformized beam of nearly collimated radiation with a selected numerical aperture;

B) multiplexing condenser means (6–8) arranged to accept the beam output of said radiation delivery means (14) and to reconfigure the beam output into a set of sub-beams, of predetermined characteristics, into a related set of at least one operational pattern sub-beam;

C) mask pattern means (9), arranged to accept the operational pattern sub-beam output of said multiplexing condenser means (6–8) and to modify such operational pattern sub-beam into a related mask-patterned sub-beam projection via-pattern; and D) projection means (11) arranged to accept said mask-patterned sub-beam projection via-pattern output of said mask pattern means (9) to provide a set of at least one related mask-patterned imaging sub-beam for via-drilling a substrate contemporaneously presented at said processing station.

21. A multiple-via-hole via-pattern drilling system, in which a substrate is temporarily presented for processing at a processing station, according to claim 20, further characterized in that:

said mask pattern means (9) and said projection means (11) are configured together as a vertical mask/projection sub-subassembly, for use in a mask-patterned laser via-drilling system, for use in any one of a set of beamline positions, comprising:
mask pattern means (9) appropriately positioned for receiving a related sub-beam from a related illumination module; and
projection means (11);
which mask pattern means and projection means are arranged to provide a via-pattern for drilling along the assigned beamline.

22. A multiple-via-hole via-pattern drilling system according to claim 20, further characterized in that:

said radiation delivery means (1–4) is arranged for multiplexing by elements in a downstream optical path; and
said downstream optical path comprises said multiplexing condenser means (6–8);
said mask pattern means (9); and said projection means (11); which means are arranged to provide a set of separate vertical subassemblies forming a finite number of beamlines each with condensing, mask-pattern, and projection functions, to provide a set of related mask-patterned imaging sub-beams for via-drilling a related set of substrate segments currently presented at said processing station.

23. A multiple-via-hole via-pattern drilling system according to claim 20, further characterized in that:

said radiation delivery means (1–4) is arranged for multiplexing by elements in a downstream optical path; and
said downstream optical path comprises a set of vertical subassemblies, one vertical subassembly for each set of one or more beamlines, each comprising for the related beamline set: said condenser means (6–8); said mask pattern means (9); and said projection means (11), which means are arranged to provide a set of separate vertical subassemblies forming a finite number of beamlines each with condensing, mask-pattern, and projection functions, to provide a set of related mask-patterned imaging sub-beams for via-drilling a related set of substrate segments contemporaneously presented at said processing station, the placement characteristics and focal length characteristics of said condenser means varying as a function of radiation path length so as to have proper mask-pattern illumination at the processing station, for each beamline.

24. A multiple-via-hole via-pattern drilling system according to claim 20, further characterized in that:

said radiation delivery means (1–4) is arranged for multiplexing by elements in a downstream optical path;
said downstream optical path comprises a set of one or more beamlines, each of said beamlines comprising a first vertical sub-subassembly and a second vertical sub-subassembly;
said first vertical sub-subassembly, for each of said beamlines, comprising beam-splitting condenser means (6–8) which provides for each beamline a related sub-beam appropriately corrected for focal length related to position, for providing the related sub-beam with appropriate characteristics; and
said second vertical subassembly for each of said beamlines comprising mask pattern means (9) appropriately positioned for receiving the related sub-beam from the related first vertical subassembly, and further comprising projection means (11), which mask pattern means and projection means are arranged to provide, in combination, a drilling via-pattern for the assigned beamline,
whereby separate first and second vertical sub-subassemblies in optical series form a finite number of beamlines each with appropriate condensing, mask-pattern, and projection functions, to provide a set of related mask-patterned imaging sub-beams for via-drilling a related set of substrate segments contemporaneously presented at said processing station, the mirror-reflectivity and placement characteristics and focal length characteristics of said first vertical subassemblies varying as a function of beamline position assignment and of beamline-position-related radiation path length so as to have proper imaging for drilling, at the processing station, for each beamline, and said second vertical subassemblies being of common design regardless of beamline position.

25. A vertical beam-splitter and condenser sub-subassembly (25-1; 25-2 . . . 25-n) for use in a mask-patterned laser via-drilling system, for installation optically downstream from a source of uniformized, shaped laser radiation, in an assigned beamline position 1, 2, 3 . . . n in a set of beamline positions for imaging a via-drilling pattern onto a substrate segment via, assigned to each beamline position 1–n, a first sub-subassembly and a second sub-subassembly in optical series characterized in that:

said first sub-subassembly comprises a partially reflective beam splitter mirror with graduated reflectivity increasing with assigned beamline position 1, 2, 3 . . . n, for dividing an input beam into a sub-beam at the assigned beamline position, to forward a positionally reduced sub-beam related to its own reflectivity and upstream optical path reflectivity related to upstream subassembly positions and to divert a beam of balanced intensity into its own assigned beamline; and
condenser lens means, for accepting said balanced sub-beam from said beam splitter mirror means for the assigned position, and focusing said balanced sub-beam, with focal length correction for optical path length differences related to beamline position, forward onto a mask position of a second sub-subassembly in the beamline position.

26. A vertical mask and projection sub-subassembly (26) for use in a mask-patterned laser via-drilling system, for installation optically downstream from a source of uniformized, shaped laser radiation, processed by upstream optics into a positionally-reduced sub-beam in any assigned beamline position 1, 2, 3 . . . n in a set of beamline positions 1–n, each beamline position being assigned for imaging a via-drilling pattern onto a substrate segment, as a second sub-subassembly to work downstream from any first sub-subassembly in optical series said vertical mask/projection sub-subassembly, comprising:

mask pattern means (9), positioned for receiving the said related balanced sub-beam from a first sub-subassembly mounted in the assigned beamline position, for forwarding a mask-patterned sub-beam for the beamline position; and projection means (11) positioned for receiving the mask-patterned sub-beam for the beamline position from said related mask pattern means (9), and for imaging said mask-patterned sub-beam for the beamline position onto a receiving means.

27. A vertical condenser, mask and projection subassembly (28) for use in a mask-patterned laser via-drilling system, for installation optically downstream from a source of uniformized, shaped laser radiation, processed by upstream optics into a positionally-reduced sub-beam in any assigned beamline position 1, 2, 3 . . . n in a set of beamline positions 1–n, each beamline position being assigned for imaging a via-drilling pattern onto a substrate segment, as a sub-subassembly to work downstream from a beam divider (27) in optical series, said vertical mask/projection sub-subassembly comprising:

condenser means;

mask pattern means (9), positioned for receiving the said related balanced sub-beam from a first sub-subassembly mounted in the assigned beamline position, for forwarding a mask-patterned sub-beam for the beamline position; and projection means (11) positioned for receiving the mask-patterned sub-beam for the beamline position from said related mask pattern means (9), and for imaging said mask-patterned sub-beam for the beamline position onto a receiving means.

28. A vertical condenser, mask and projection subassembly (28) according to claim 27, wherein said condenser means is adjustable for focus.

* * * * *